United States Patent [19]

Uetrecht

[11] 4,400,668

[45] Aug. 23, 1983

[54] PERIOD PROPORTIONAL TWO-PHASE VOLTAGE CONTROLLED OSCILLATOR

[75] Inventor: Dale M. Uetrecht, Colerain Township, Hamilton County, Ohio

[73] Assignee: Baldwin Piano & Organ Company, Cincinnati, Ohio

[21] Appl. No.: 275,356

[22] Filed: Jun. 19, 1981

Related U.S. Application Data

[62] Division of Ser. No. 162,631, Jun. 24, 1980, Pat. No. 4,343,219.

[51] Int. Cl.³ .............................................. H03K 3/28
[52] U.S. Cl. ....................................... 331/45; 331/74; 331/111; 331/177 R; 331/DIG. 3
[58] Field of Search ............. 331/111, DIG. 3, 177 R, 331/45, 74

[56] References Cited

U.S. PATENT DOCUMENTS 3,395,362  7/1968  Sutherland ..................... 331/111 X
3,512,106  5/1970  Rosenthal ......................... 331/111

Primary Examiner—Siegfried H. Grimm
Attorney, Agent, or Firm—Kirkland & Ellis

[57] ABSTRACT

A two-phase, period-proportional voltage-controlled oscillator circuit is provided for clocking an analog delay line which can be used, for example, in an electronic musical instrument. The voltage-controlled oscillator circuit provides two clock output signals of opposite phase and having a period directly proportional to the control voltage, i.e., the frequency of the two clock signals is inversely proportional to the control voltage. Since the delay provided by the analog delay line is directly proportional to the period of the clock signals, the delay is directly proportional to the control voltage thereby eliminating a source of distortion in a delay modulation system.

3 Claims, 4 Drawing Figures

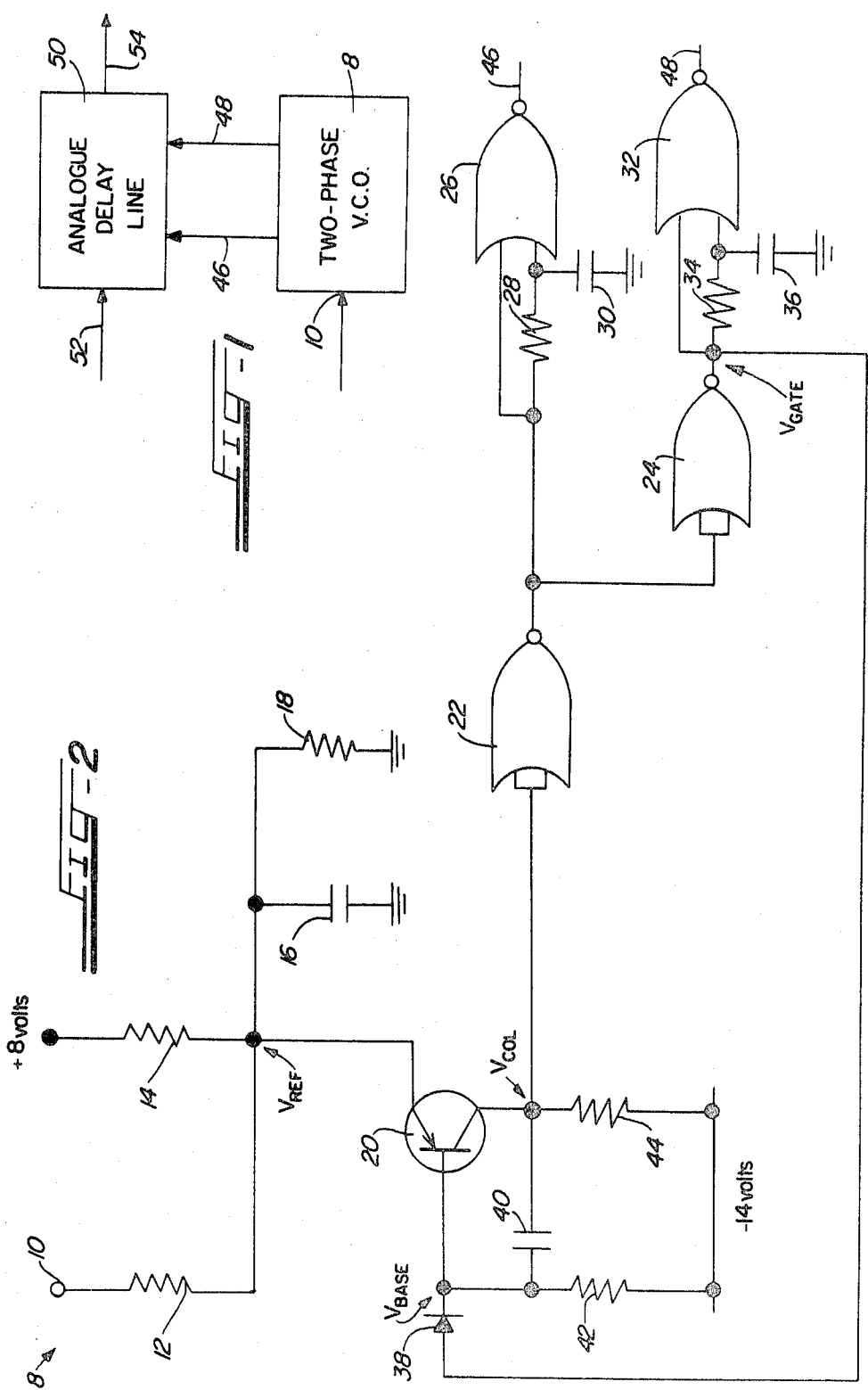

PERIOD PROPORTIONAL TWO-PHASE VOLTAGE CONTROLLED OSCILLATOR

This is a division of application Ser. No. 162,631 filed June 24, 1980 and now U.S. Pat. No. 4,343,219.

BACKGROUND OF THE INVENTION

1. Field of the Invention

The present invention relates to an electronic musical instrument and more specifically to an analog delay line driven by two clock output signals of opposite phase provided by a voltage-controlled oscillator, the two clock output signals being of a frequency which is inversely proportional to the control voltage applied at the modulation input of the voltage-controlled oscillator, the analog delay line thereby providing delay which is directly proportional to the control voltage and eliminating distortion which arises when delay is a non-linear function of the control voltage.

2. Description of the Prior Art

Various types of voltage-controlled oscillator circuits for driving analog delay lines are described in the prior art. A two-phase, voltage-controlled oscillator, for example, is used as a clock in the tone modulation system of U.S. Pat. No. 4,031,795 issued to Bunger. Such two-phase, voltage-controlled oscillators are illustrated in blocks 12, 27 and 33 in FIG. 1 of the Bunger patent, where they are utilized to drive analog shift registers 11, 26 and 32, respectively. Voltage-controlled oscillators of various types are also used to provide clock signals for driving analog delay lines in U.S. Pat. No. 4,038,898—Kniepkamp et al.; U.S. Pat. No. 3,833,752—van der Kooij; U.S. Pat. No. 3,866,505—Adachi; U.S. Pat. No. 4,043,243—Peterson; U.S. Pat. No. 4,080,861—Wholahan; U.S. Pat. No. 4,144,790—Suchoff; and U.S. Pat. No. 4,096,778—Dittmar.

The operation of previously known voltage-controlled oscillators for providing clock signals to drive analog delay lines differs fundamentally from the operation of the present invention in that the output frequency of prior art voltage-controlled oscillators is directly proportional to the control voltage applied. The present voltage-controlled oscillator circuit provides the reciprocal relationship between frequency and control voltage to that of prior art circuits; i.e., the present voltage-controlled oscillator circuit produces output signals whose period (rather than frequency) is directly proportional to the control voltage applied at the input of the circuit. The delay provided by an analog delay line is directly proportional to the period of the clock signals which drive it. Prior art tone modulation systems, such as that disclosed in the Bunger patent, introduce frequency distortion in the audio signal being delayed because of the non-linear relationship between delay and control voltage. This non-linear relationship results because the delay is inversely proportional to the frequency of the clock signal, while the frequency of the clock signal in prior art circuits is directly proportional to the control voltage; hence the delay is inversely proportional to the control voltage. The use of a period-proportional voltage-controlled oscillator in the present invention produces a more symmetrical modulation which sounds better, especially for large amounts of modulation. It also provides for a smoother string chorus modulation, and eliminates the need for a calibrating adjustment during production with a corresponding saving of labor.

SUMMARY OF THE INVENTION

The present invention utilizes a period-proportional voltage-controlled oscillator circuit to provide two opposite phase clock signals which drive an analog delay line. Since the delay introduced by an analog delay line to a signal applied to its input is directly proportional to the period of the clock signals which drive it, and the period of the clock signals is directly proportional to the modulation control voltage applied to the period-proportional oscillator of the present invention, the delay introduced is directly proportional to the modulation control voltage. The linear relationship between control voltage and delay does not introduce delay distortion to the signal delayed by the analog delay line, which occurs if that relationship is non-linear.

In the period-proportional voltage-controlled oscillator of the present invention, the modulation control voltage is applied to the emitter terminal of a pnp transistor which is biased at an appropriate voltage level. The collector of the transistor is connected to the input of a first inverter, the output of which is connected to the input of a second inverter. The output of the first inverter is also connected to both inputs of a first NOR gate, the output of which provides one of the output signals. The output of the second inverter is connected to both inputs of a second NOR gate, the output of which provides the second output signal.

The output of the second inverter is also connected through a diode to the base of the transistor. The base of the transistor is connected via a capacitor to the collector terminal, and through a resistor to a reference voltage source of −14 volts. In addition, a resistor is connected between the collector terminal of the transistor and the −14 volt source. By this arrangement, the capacitor connected between the base and the collector of the transistor alternately charges and discharges as the transistor is turned on and off, thereby raising and lowering the voltage at the collector of the transistor, first increasing to a level above the threshold of the first inverter and then decreasing to a level below the threshold of the first inverter. Thus, the output of the first inverter alternately switches between "low" and "high" logic states. The first and second NOR gates also each provide an output signal having a logic state which alternately switches between low and high. The presence of the second inverter between the first inverter and the second NOR gate assures that the two output signals are in opposite phase, which may be required to drive an analog delay line as in the preferred embodiment. A resistor and capacitor connected to one input of both the first and second NOR gates provides sufficient delay in switching from output low to output high, so that the outputs of the first and second NOR gates never overlap, i.e., these delay circuits insure that the first and second NOR gates do not momentarily have the same output high state during switching. Consequently only one output signal will be in the active high state at any time.

Thus, it is an object of the present invention to provide a system for delay modulating an audio signal in which the delay is directly proportional to a modulation control voltage, whereby distortion to the audio signal modulation will be minimized.

It is a further object of the present invention to provide a voltage-controlled oscillator for producing an output signal having a period that is directly proportional to the modulation control voltage for use in driving an analog delay line or analog shift register.

These and other objects, advantages, and features will hereinafter appear, and for purpose of illustration, but not for limitation, exemplary embodiments of the present invention are illustrated in the accompanying drawings.

BRIEF DESCRIPTION OF THE DRAWINGS

FIG. 1 is a block diagram illustrating how the clock output signals of the period proportional voltage-controlled oscillator are used to drive an analog delay line.

FIG. 2 is a circuit diagram showing the period proportional two-phase, voltage-controlled oscillator of the preferred embodiment of the present invention.

DETAILED DESCRIPTION OF THE PREFERRED EMBODIMENT

Figure 3:
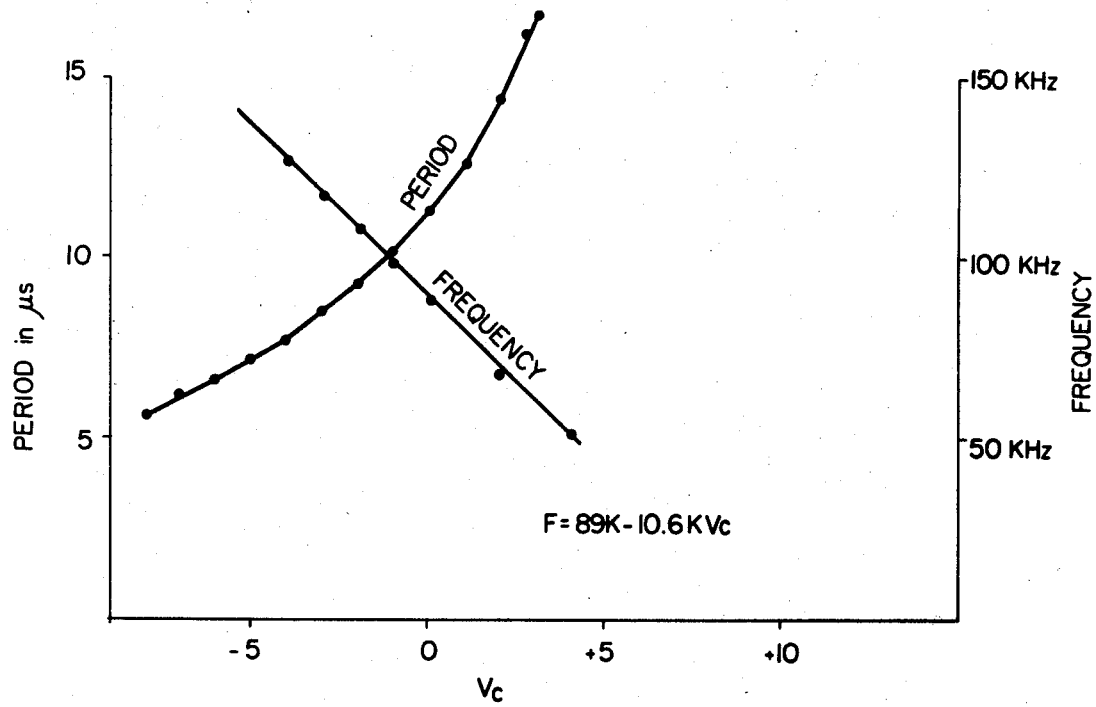
FIG. 3 is a graph illustrating the relationships between clock frequency and period as functions of modulation control voltage for a frequency-proportional voltage-controlled oscillator.

With reference to the block diagram in FIG. 1, two non-overlapping clock signals are connected via lines 46 and 48 from the outputs of a voltage-controlled oscillator 8 to analog delay line 50. Analog delay line 50 can be a bucket brigade line or analog shift register which is driven in two phases by the clock signals from period-proportional voltage-controlled oscillator 8. The analog delay line 50 provides a nominal delay to signals applied to its input 52 as they are passed to output 54. As is generally known, an analog delay line or shift register operates by sampling the incoming signal into consecutive pulses of an amplitude proportional to the instantaneous amplitude of the incoming signal at the time of sampling. An audio signal applied to the input of the shift register is sampled with the frequency of the clock pulses of a first clock signal and is transmitted or shifted to successive stages by alternately clocking with a second clock signal of the same frequency. Each sample of the input audio signal reaches the output of the shift register after $n/2f_c$ seconds, where n is the number of stages in the shift register (or "buckets" in the "bucket brigade") and $f_c$ is the frequency of the clock signal, which in the present invention is provided by the voltage-controlled oscillator. Thus, it is apparent that delay is directly proportional to the period (the inverse of the frequency) of the clock signal. If the period of the clock signals provided by voltage-controlled oscillator 8 is modulated at a slow rate, the output of the analog delay line 50 will be delay modulated, delay time being directly proportional to clock period and modulation control voltage.

As discussed in the co-pending application entitled "Chorus Generator System," Ser. No. 162,540, filed June 24, 1980 and now U.S. Pat. No. 4,384,505, assigned to the same assignee as the present invention, previously-used oscillators were frequency proportional which caused large changes in frequency to result in the envelope of the sampled signal at the output of the analog delay line to be a poor reproduction of the modulation waveform. The period-proportional oscillator circuit described herein provides an output frequency having a period directly proportional to the modulation control voltage (see FIG. 4). Since an analog delay line, which this oscillator is designed to clock, introduces a delay which is directly proportional to the period of the clock signal, the audio delay produced by the analog delay line is directly proportional to the modulation control voltage injected at the modulation input. The benefits of the period-proportional oscillator circuit for providing the clocking signal to drive an analog delay line having a delay which is proportional to the period of the clock is illustrated by the following tables:

TABLE 1

| |
|---|
| $f = f_o + (f_o/2) \sin wt$ |
| $\sin wt$ = instantaneous modulation voltage (normalized) |
| $w = 2\pi$ times the frequency of the modulation control voltage |
| $f_o = 100$ KHz ($T_o = 10$ microseconds) |
| $f_{max} = 150$ KHz ($T_{min} = 6.667$ microseconds) |
| $f_{min} = 50$ KHz ($T_{max} = 20$ microseconds) |

The equation in Table 1 is for the instantaneous frequency of the output signals of an exemplary voltage-controlled oscillator that is frequency proportional. It can be seen from Table 1 that when the control voltage varies sinusoidally, the frequency of the output signal changes ±50%, whereas the period of the output signal changes from +100% to −33%. The linear relationship between control voltage and frequency, and the non-linear relationship between control voltage and period, for a frequency-proportional voltage-controlled oscillator is illustrated in FIG. 3.

TABLE 2

| |
|---|
| $T = T_o + (T_o/2) \sin wt$ |
| $\sin wt$ = instantaneous modulation voltage (normalized) |
| $w = 2\pi$ times the frequency of the modulation control voltage |
| $T = 10$ microseconds ($f_o = 100$ KHz) |
| $T_{max} = 15$ microseconds ($f_{min} = 66.67$ KHz) |
| $T_{min} = 5$ microseconds ($f_{max} = 200$ KHz) |

Figure 4:
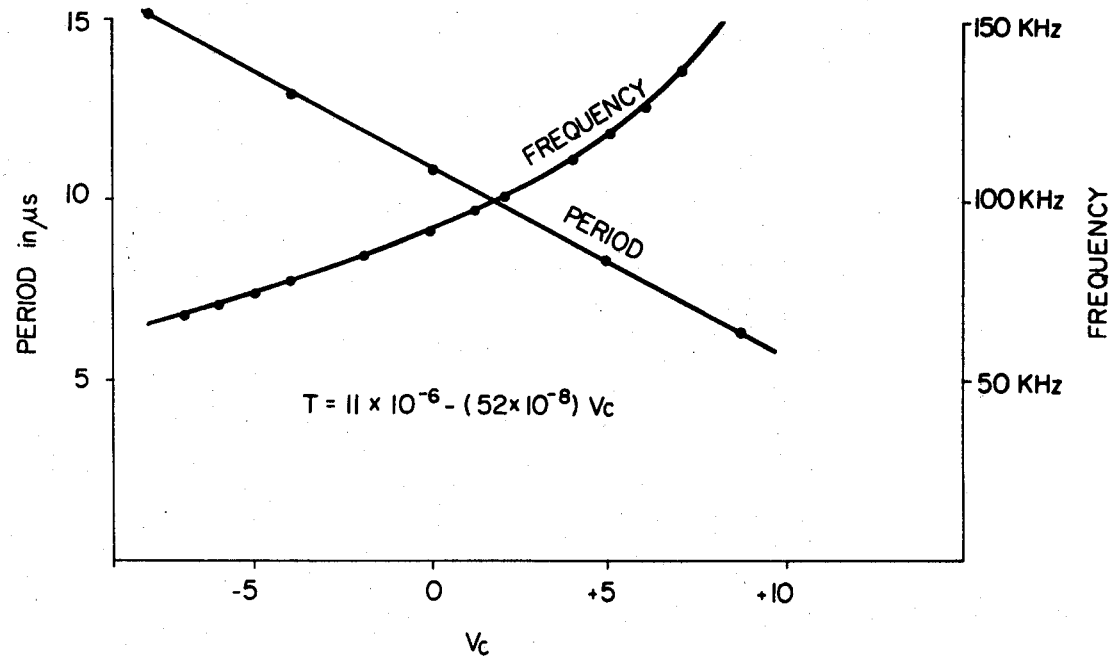
FIG. 4 is a graph illustrating the relationships between clock frequency and period as functions of modulation control voltage for a period-proportional voltage-controlled oscillator.

The general equation in Table 2 is for the instantaneous period of the output signals of an exemplary voltage controlled oscillator that is period proportional. It can be seen that the relationship between control voltage and the period of the output signal is the inverse of Table 1. Thus, when control voltage varies sinusoidally, the period of the output signal changes ±50%. The linear relationship between control voltage and period, and the non-linear relationship between control voltage and frequency, for a period-proportional voltage-controlled oscillator is illustrated in FIG. 4.

The benefits of a period proportional oscillator are particularly evident when there are two modulation control voltage signals:

$$f = f_o + (f_o/4) \sin w_{m1}t + (f_o/4) \sin w_{m2}t$$

$$T = T_o + (T_o/4) \sin w_{m1} + (T_o/4) \sin w_{m2}t$$

where:

$w_{m1} = 2\pi f_{m1}$ ($f_{m1}$ is approximately 1 Hz)

$w_{m2} = 2\pi f_{m2}$ ($f_{m2}$ is approximately 6 Hz)

When $\sin w_{m1}$ is equal to 1, the effect from $w_{m2}$ is diminished. Similarly, the effect from $w_{m2}$ is enhanced when sin $w_{m1}$ is equal to $-1$. Since $f_{m1}$ is approximately constant with respect to $f_{m2}$, it is apparent that the contribution from the third factor in the equation for instantaneous frequency varies over time. Therefore, it is apparent that when the relationship between period and the modulating signal is non-linear, as it is for frequency-proportional voltage-controlled oscillators, distortion occurs. Since there is a linear relationship between the period and the modulating signals applied to period-proportional voltage-controlled oscillators, the equation for the instantaneous period demonstrates that no such distortion occurs.

With reference to FIG. 2, the circuit illustrates the period-proportional voltage-controlled oscillator of the preferred embodiment. The modulation control voltage is applied to period-proportional oscillator 8 via terminal 10 through resistor 12 to the emitter of transistor 20. The voltage at the emitter of transistor 20, denominated herein as $V_{ref}$, is determined by the modulation control voltage applied to terminal 10 and the bias provided by the source of potential of $+8$ volts connected to the resistor divider network consisting of resistors 14 and 18. Capacitor 16 provides filtering to smooth out the voltage at the emitter of transistor 20, $V_{ref}$. The voltage at the collector of transistor 20, $V_{col}$, is applied to both inputs of NOR gate 22, which functions as an inverter. The output of NOR gate 22 is applied to both inputs of NOR gate 24, which also functions as an inverter. The output of NOR gate 22 is also applied directly to one terminal of NOR gate 26 and through resistor 28 to the other terminal of NOR gate 26, which is connected to ground through capacitor 30. Similarly, the output of NOR gate 24 is applied directly to one input of NOR gate 32 and through resistor 34 to the other input of NOR gate 32, which is connected to ground through capacitor 36. NOR gates 22, 24, 26 and 32 all serve to invert the logic level applied to their respective inputs, since the pair of inputs for each NOR gate is connected (directly or indirectly through a resistor) to a common node. Thus, when the logic level applied to the inputs of NOR gate 22 is low, the logic level supplied at the output of NOR gate 22 is high and the output of NOR gate 24 is low.

The voltage level at the output of NOR gate 24 is denominated herein as $V_{gate}$. The output of NOR gate 24, in addition to being connected to the inputs of NOR gate 32, is connected through diode 38 to the base of transistor 20. Diode 38 serves to isolate the base of transistor 20 from the output of NOR gate 24 when the output of NOR gate 24 is low. In addition, diode 38 provides temperature compensation to the base of transistor 20 to compensate for the base-emitter junction of transistor 20. The base of transistor 20 is connected via capacitor 40 to the collector of transistor 20. The base of transistor 20 is also connected through resistor 42 to a source of potential of $-14$ volts. Similarly, the collector of transistor 20 is connected through resistor 44 to the source of potential of $-14$ volts. NOR gates 22, 24, 26 and 32 can be CMOS type 4001 which require a supply voltage of $+8$ volts with respect to ground. Furthermore, NOR gates 22 and 24 can be other types of inverters rather than NOR gates, as can NOR gates 28 and 34 in applications in which the resistor/capacitor delay circuitry is not needed.

Assuming that the voltage-controlled oscillator circuit 8 is in the state in which the output of NOR gate 24 is high (i.e., at $+8$ volts) the voltage at the base of transistor 20, denominated herein as $V_{base}$, will be 8 volts minus the forward voltage drop across diode 38. Since transistor 20 is of the pnp type, the positive voltage at the base of transistor 20 will turn transistor 20 off. During this portion of the cycle the voltage at the collector of transistor 20 will decrease as capacitor 40 is discharged through resistor 44. When capacitor 40 is discharged to the level at which $V_{col}$ is below the threshold of NOR gate 22 (e.g., in the range of about $+4$ volts) the output of NOR gate 22 switches to the high state, thereby causing the output of NOR gate 24 to switch to the low state, thus switching $V_{gate}$ negative. At this time, $V_{base}$ is clamped at one diode drop (provided by the base-emitter junction of transistor 20) below $V_{ref}$ by transistor 20, which will now be in the on state. During this portion of the cycle $V_{col}$ increases in the positive direction due to the collector current flowing from the collector of transistor 20 through capacitor 40 and resistor 42. As the charge on capacitor 40 increases, $V_{col}$ becomes more positive until the threshold voltage of NOR gate 22 is reached, which causes the output of NOR gate 22 to switch low, at which time the cycle is repeated again.

The change in voltage at the base of transistor 20 when $V_{gate}$ switches from low to high is denominated herein as $V_{ch}$. $V_{base}$ after $V_{gate}$ switches high is equal to 8 volts minus the voltage drop across diode 38 and the voltage after $V_{gate}$ switches low is equal to $V_{ref}$ minus the voltage drop across the base-emitter junction of transistor 20. Therefore, $V_{ch}$ is approximately equal to 8 minus $V_{ref}$. While $V_{col}$ is increasing positively, the average current $I_1$ flowing through capacitor 40 and resistor 42 is equal to the voltage of $V_{ref}$ minus the voltage drop across the base-emitter junction plus 14 volts (which is approximately equal to 13.4 plus $V_{ref}$) divided by the value of resistor 42. That is, the current $I_1$ is approximately equal to the quantity 13.4 plus $V_{ref}$ divided by the resistance of resistor 42. The time $T_1$ which it takes for $V_{col}$ to attain the threshold voltage is equal to the value of capacitor 40 multiplied by the change in the voltage $V_{base}$ when $V_{gate}$ switches from low to high $(V_{ch})$, divided by the current $I_1$, or $CV_{th}/I_1$.

After $T_1$ when Vcol reaches the gate threshold level NOR gate 22 switches its output low. The output of NOR gate 22 is applied to both inputs of NOR gate 24 causing the output of NOR gate 24 to switch to high, thereby causing $V_{gate}$ to switch to $+8$ volts. At this moment, $V_{base}$ and $V_{col}$ (since the voltage across capacitor 40 cannot change instantaneously) are switched positive by an amount equal to the change in voltage of $V_{base}$ (i.e., as NOR gate 24 switches from low to high). Transistor 20 will be off since $V_{base}$ is now positive. The voltage level $V_{col}$ decreases as capacitor 40 discharges through resistor 44. Capacitor 40 continues to discharge, thereby decreasing the voltage $V_{col}$, until the threshold voltage of NOR gate 22 is reached again. The time which it takes for the voltage $V_{col}$ to fall to the threshold voltage of NOR gate 22 is $T_2$. During this time, the average voltage at the collector, $V_{col}$, is equal to the threshold level of NOR gate 22 (denominated $V_{th}$) plus one-half the change in $V_{base}$. Therefore, the average current, $I_2$, flowing through capacitor 40 during the time $T_2$ is equal to $(14 + V_{th} + V_{ch}/2)/R$, where R is the value of resistor 44. Therefore, the time $T_2$ is equal to $CV_{ch}/I_2$, where C is equal to the value of capacitor 40.

The voltage $V_{ref}$ varies with the modulation control voltage applied to terminal 10. Since the modulation control voltage is on the order of one to two volts, the change in $V_{ref}$ is small compared to the voltage across resistors 42 and 44. Therefore, it is seen from the foregoing equations that $T_1$ and $T_2$ are approximately proportional to $V_{ch}$. From this it follows that the period of oscillation, which is equal to the sum of $T_1$ plus $T_2$, is directly proportional to $V_{ch}$. Thus voltage-controlled oscillator 8 is period proportional.

Period-proportional oscillator 8 produces two opposite phase, non-overlapping clock output signals on output lines 46 and 48. The clock output signals on lines 46 and 48 are made non-overlapping by the resistor and capacitor network attached to one input of NOR gates 26 and 32. Thus, when the output of NOR gate 22 switches from high to low, one input of NOR gate 26 is immediately at the low logic level. However, the second input of NOR gate 26 does not reach the low logic level until capacitor 30 has discharged through resistor 28. This delay assures that NOR gate 32 will have changed state by the time both inputs to NOR gate 26 have reached the low logic state. When NOR gate 22 is low the output of NOR gate 24 is high and the output of NOR gate 32 will be low. When the output of NOR gate 22 switches from low to high, the first input of NOR gate 32 immediately switches to the low state (because of NOR gate 24); however, the second input to NOR gate 32 remains high until capacitor 34 has discharged to the threshold of NOR gate 26. This delay assures that NOR gate 26 will change state by the time that both inputs to NOR gate 32 have reached the low logic state. Thus, NOR gates 26 and 32 are prevented from simultaneously having their output levels in the high state. The delay by resistor 28 and capacitor 30 must be longer than the delay by resistor 34 and capacitor 36 in order to compensate for the delay of gate 24.

While the preferred embodiment of the invention has been illustrated and described, it is to be understood that the invention is not limited to the precise construction herein disclosed, and the right is reserved to all changes and modifications coming within the scope of the invention as defined in the appended claims.

I claim:

1. A period-proportional voltage-controlled oscillator apparatus comprising:
   a transistor;
   bias means connected to a first source of operating potential for biasing the emitter of said transistor;
   means for connecting the emitter of said transistor to a source of time varying modulation control voltage;
   capacitive means connected between the base of said transistor and the collector of said transistor;
   first impedance means connecting the base of said transistor to a second source of operating potential;
   second impedance means connecting the collector of said transistor to the second source of operating potential;
   first inverter means having its input connected to the collector of said transistor for providing a first output signal;
   second inverter means having its input connected to the output of said first inverter means for providing a second output signal; and
   diode means connecting the output of said second inverter means to the base of said transistor;
   whereby when the output of said second inverter means is in a first state, said diode is forward biased and said transistor is in the off state thereby causing said capacitive means to discharge through said second impedance means and the voltage level at the collector of said transistor to decrease until the threshold voltage of said first inverter means is reached, at which time the output of said first inverter means switches from a second state to the first state thereby causing the output of said second inverter means to switch from the first state to the second state, thereby in turn reverse biasing said diode and causing said transistor to switch to the on state, thereby further causing said capacitive means to charge through said first impedance means until the threshold voltage of said first inverter means is reached, at which time the output of said first inverter means again switches states and the cycle is repeated, and whereby the period of said first and second output signals is directly proportional to the amplitude of the modulation control voltage.

2. A period-proportional voltage-controlled oscillator apparatus comprising:
   a transistor;
   bias means connected to a first source of operating potential for biasing the emitter of said transistor;
   means for connecting the emitter of said transistor to a source of modulation control voltage;
   a capacitor connected between the base of said transistor and the collector of said transistor;
   a first resistor connecting the base of said transistor to a second source of operating potential;
   a second resistor connecting the collector of said transistor to the second source of operating potential;
   first inverter means having its input connected to the collector of said transistor for providing a first output signal;
   second inverter means having its input connected to the output of said first inverter means for providing a second output signal; and
   diode means connecting the output of said second inverter means to the base of said transistor, whereby said first and second output signals of the same frequency are provided at the output of said first and second inverter means, respectively, each alternating between first and second voltage levels and not overlapping for one of said first and second voltage levels.

3. The apparatus as claimed in claim 2 wherein the period of said first and second output signals is directly proportional to the amplitude of a time varying modulation control voltage applied to the emitter of said transistor.

* * * * *